(12) United States Patent
Minamio et al.

(10) Patent No.: US 7,822,090 B2
(45) Date of Patent: Oct. 26, 2010

(54) SEMICONDUCTOR DEVICE

(75) Inventors: Masanori Minamio, Osaka (JP);
Noriyuki Yoshikawa, Osaka (JP);
Shinichi Ijima, Osaka (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/186,979

(22) Filed: Aug. 6, 2008

(65) Prior Publication Data
US 2009/0086769 A1 Apr. 2, 2009

(30) Foreign Application Priority Data
Sep. 28, 2007 (JP) ............... 2007-253205

(51) Int. Cl.
*H01S 5/00* (2006.01)
*H01S 3/30* (2006.01)
*H01S 3/04* (2006.01)
*H01L 29/16* (2006.01)

(52) U.S. Cl. .................. 372/49.01; 372/5; 372/36; 372/43.01; 257/82

(58) Field of Classification Search ........... 372/5, 372/43.01, 36; 257/82
See application file for complete search history.

(56) References Cited

U.S. PATENT DOCUMENTS

| | | | |
|---|---|---|---|
| 5,392,305 A | 2/1995 | Jakobson | |
| 5,783,818 A * | 7/1998 | Manabe et al. | 250/239 |
| 5,974,070 A * | 10/1999 | Haase et al. | 372/49.01 |
| 6,876,685 B2 * | 4/2005 | Umemoto et al. | 372/43.01 |
| 7,646,798 B2 * | 1/2010 | Michiue et al. | 372/49.01 |
| 2003/0214987 A1 * | 11/2003 | Yamanaka et al. | 372/43 |
| 2005/0265413 A1 | 12/2005 | Tsuda et al. | |
| 2006/0068516 A1 | 3/2006 | Hanaoka et al. | |
| 2006/0133441 A1 * | 6/2006 | Arakida et al. | 372/49.01 |
| 2007/0029571 A1 | 2/2007 | Hanaoka et al. | |
| 2007/0147449 A1 | 6/2007 | Bessho et al. | |
| 2007/0177646 A1 * | 8/2007 | Sogabe et al. | 372/49.01 |
| 2007/0211776 A1 * | 9/2007 | Yoshida et al. | 372/49.01 |

FOREIGN PATENT DOCUMENTS

| | | |
|---|---|---|
| JP | 2004-14820 | 1/2004 |
| JP | 2006-13436 | 1/2006 |
| JP | 2006-128629 | 5/2006 |
| JP | 2006-140441 | 6/2006 |

* cited by examiner

*Primary Examiner*—Minsun Harvey
*Assistant Examiner*—Phillip Nguyen
(74) *Attorney, Agent, or Firm*—McDermott Will & Emery LLP

(57) ABSTRACT

A semiconductor device includes an optical semiconductor element, a package including a base made of a metal for mounting the optical semiconductor element, and a cap for encapsulating the optical semiconductor element and a gas by covering the package and the optical semiconductor element. The gas encapsulated with the package has an oxygen concentration not less than 15% and less than 30% and has a dew-point not less than −15° C. and not more than −5° C.

17 Claims, 6 Drawing Sheets

FIG. 2

| OXYGEN CONCENTRATION / DEW-POINT | 50% | 30% | 15% | 10% |
|---|---|---|---|---|
| −3°C | ×<br>degraded/dew | ×<br>dew | ×<br>dew | ×<br>dew |
| −5°C | − | ○ | ○ | − |
| −15°C | − | ○ | ○ | − |
| −20°C | ×<br>degraded | ○ | ×<br>Iop increased | ×<br>Iop increased |

Operation Condition: wavelength of 405nm, CW 20mW, Tc=70°C

SEMICONDUCTOR DEVICE

CROSS-REFERENCE TO RELATED APPLICATIONS

This application claims priority under 35 U.S.C. §119 on Patent Application No. 2007-253205 filed in Japan on Sep. 28, 2007, the entire contents of which are hereby incorporated by reference.

BACKGROUND OF THE INVENTION

The present invention relates to a semiconductor device including an optical semiconductor element for emitting light of a wavelength ranging from a blue region to a ultraviolet region.

In a highly developed information society where image information with high capacity is transported through cellular phones or internet, there is a demand for development of optical disk technique with higher speed and higher capacity for storing the high capacity information. In order to cope with such a demand, a semiconductor laser diode used in an optical pickup of an optical disk apparatus has been reduced in the wavelength from 780 nm to 650 nm so as to increase the capacity of an optical disk, and the wavelength is being further reduced to a 400 nm band for further increasing the capacity of an optical disk.

Also, an optical semiconductor element such as a semiconductor laser diode for emitting light of a wavelength of a 400 nm band or in the vicinity of 400 nm, that is, a region of a blue, violet or ultraviolet, is built on a package including a metal base, so as to be fabricated as a semiconductor device in which a gas is encapsulated within a space surrounded by the package and a cap having an optical member for taking out emitted light.

In the semiconductor device thus fabricated, various substances may adhere within or enter the space enclosed by the package including the optical semiconductor element and the cap during the fabrication. When light emitted by the optical semiconductor element outgoes from the end facet of a cavity with the various substances present within the enclosed space, a product is produced and adhered onto the end facet of the cavity, and therefore, the optical characteristic and the electric characteristic of the optical semiconductor element of the semiconductor device are disadvantageously degraded.

In order to prevent the thus produced product from adhering as a contaminant onto the emitting end facet of the optical semiconductor element, a structure in which an absorbent is provided within the space where the optical semiconductor element is encapsulated has been disclosed (see, for example, Japanese Laid-Open Patent Publication No. 2004-14820). This absorbent prevents the product from adhering onto the emitting end facet by previously absorbing the product and a material of the product floating within the space where the optical semiconductor element is encapsulated. However, since the absorbent is disposed in the vicinity of the optical semiconductor element, the semiconductor device including them is increased in the size, and hence, whole equipment including the semiconductor device cannot be made compact and thin.

Therefore, in order to solve the aforementioned problem with the general package shape retained and without increasing the size of the semiconductor device, a structure in which the product is prevented from adhering onto the end facet of the cavity by suppressing low the dew-point and the oxygen concentration of the atmosphere of the space where the optical semiconductor element is encapsulated has been proposed. Specifically, the production of the product that may black the end facet of the cavity with time is thus prevented, and the lifetime of a nitride semiconductor laser diode for emitting light of a wavelength not more than 420 nm is increased (see, for example, Japanese Laid-Open Patent Publication No. 2006-13436).

Furthermore, as a method for suppressing low the dew-point and the oxygen concentration of the atmosphere within the space where the optical semiconductor element is encapsulated, a fabrication method additionally including a baking process for cleaning by previously baking a semiconductor laser diode, a cap and a package or including an ashing process for cleaning by exposing the semiconductor laser diode and the like to ozone and excited oxygen atoms has been proposed (see, for example, Japanese Laid-Open Patent Publication Nos. 2006-128629 and 2006-140441). When such a process is additionally performed, a nitride semiconductor laser diode can be driven for light emission for a long period of time without lowering the emission intensity even in a high temperature atmosphere.

However, in the structures or methods disclosed in Japanese Laid-Open Patent Publication Nos. 2006-13436, 2006-128629 and 2006-140441, the product cannot be prevented from adhering onto the emitting facet of the optical semiconductor element unless the dew-point is suppressed as low as −30° C. or less and the oxygen concentration is suppressed as low as 100 ppm or less in the atmosphere of the space where the optical semiconductor element is encapsulated. Furthermore, the semiconductor device is difficult to operate for a long period of time without lowering the optical output from the end facet of the optical semiconductor element unless the dew-point and the oxygen concentration are suppressed to sufficiently low values in the enclosed space. Moreover, in order to attain a dew-point of −30° C. or less and the oxygen concentration of 100 pm or less in the atmosphere of the space where the optical semiconductor element is encapsulated, it is necessary to fabricate the semiconductor device by employing special facilities, for example, by providing an apparatus used for assembling the optical semiconductor element within a glove box. Thus, it is impossible to fabricate such a semiconductor device at low cost with simple facilities.

SUMMARY OF THE INVENTION

In consideration of the aforementioned conventional problems, an object of the invention is realizing a semiconductor device, which includes an optical semiconductor device, for emitting light of a wavelength of a ultraviolet to blue region, fabricated in an atmosphere with facilities employed for assembling a general optical semiconductor element without employing special facilities for controlling the oxygen concentration and the dew-point of an encapsulated gas, and which attains a long lifetime without lowering the emission intensity.

In order to achieve the object, in the semiconductor device of this invention, an optical semiconductor element is covered with a package including a base and a cap so as to be encapsulated together with a gas including oxygen and moisture respectively in controlled ratios.

Specifically, the semiconductor device of this invention includes an optical semiconductor element; a package including a base made of a metal for mounting the optical semiconductor element; and a cap for encapsulating the optical semiconductor element and a gas by covering the package and the optical semiconductor element, and the gas has an oxygen concentration not less than 15% and less than 30% and has a dew-point not less than −15° C. and not more than −5° C.

In the semiconductor device of this invention, adhesion of a product onto an end facet of the optical semiconductor element for emitting output light can be suppressed or prevented, and therefore, the optical semiconductor element can continuously emit strong output light stably for a long period of time. Also, since the oxygen concentration and the dewpoint of the gas encapsulated within the semiconductor device are close to those of general air, there is no need to use any special facility but facilities and an environment employed for assembling general optical semiconductor elements can be used for assembling the present semiconductor device. Therefore, the semiconductor device of this invention can be easily assembled and inexpensively fabricated.

In the semiconductor device of this invention, the optical semiconductor element is preferably a semiconductor laser diode or an edge emitting light emitting diode including a cavity formed by opposing end facets.

In the semiconductor device of this invention, the optical semiconductor element preferably emits light of a wavelength of 450 nm or less.

In the semiconductor device of this invention, the optical semiconductor element is preferably made of a nitride semiconductor material.

Thus, an optical semiconductor element highly efficient in photoelectric conversion and capable of emitting light of a wavelength of a ultraviolet to blue region can be formed, and the adhesion of a product onto the end facet of the optical semiconductor element for emitting the output light can be suppressed and prevented. Therefore, the optical semiconductor element can continuously emit the strong output light stably for a long period of time.

In the semiconductor device of this invention, the gas preferably includes 70% or more of inert gas.

In the semiconductor device of this invention, the inert gas preferably includes at least one of nitrogen and argon.

In the semiconductor device of this invention, the inert gas is preferably nitrogen.

Thus, the adhesion of a product onto the end facet of the optical semiconductor element for emitting the output light can be suppressed and prevented, and therefore, the optical semiconductor element can continuously emit the strong output light stably for a long period of time.

In the semiconductor device of this invention, the optical semiconductor element preferably includes an edge coating made of a material including zirconium and formed on an end facet thereof for emitting light.

Thus, a moisture component and a part of materials of the product can be shut off, and hence, the adhesion of the product onto the end facet of the optical semiconductor element for emitting the output light can be suppressed and prevented. Therefore, the optical semiconductor element can continuously emit the strong output light stably for a long period of time.

The semiconductor device of this invention preferably further includes a sub-mount provided between the optical semiconductor element and the base and having a high heat dissipation property.

Thus, the optical semiconductor element can be mounted with a high heat dissipation property on a module base or a circuit substrate through the sub-mount having a high heat dissipation property, and therefore, the optical semiconductor element can continuously emit the strong output light further stably for a long period of time.

In the semiconductor device of this invention, a portion of the package excluding the base is preferably made of a metal, the cap preferably includes a cylindrical metal member and a transparent optical member provided on the metal member for transmitting output light from the optical semiconductor element, and the package and the metal member are preferably welded to each other.

Alternatively, in the semiconductor device of this invention, a portion of the package excluding the base is preferably made of a resin, the cap is preferably made of a transparent optical member, and the package and the cap are preferably adhered to each other through an adhesive.

Alternatively, in the semiconductor device of this invention, a portion of the package excluding the base is preferably made of ceramics, the cap is preferably made of a transparent optical member, and the package and the cap are preferably adhered to each other through an adhesive.

Thus, the base of the package can be provided on a module base or a circuit substrate with a high heat dissipation property, and hence, the optical semiconductor element can continuously emit the strong output light further stably for a long period of time.

The semiconductor device of this invention preferably further includes a light receiving element or a semiconductor element including a light receiving element provided between the optical semiconductor element and the base.

In the semiconductor device of this invention, the optical semiconductor element is preferably mounted on a principal plane of the semiconductor element or in a recess formed on the principal plane.

Thus, the semiconductor element can be integrated on the base to be covered by the package and the cap, and hence, the optical semiconductor element can continuously emit the strong output light stably for a long period of time.

In this manner, according to the semiconductor device of this invention, the adhesion of a product onto the end facet of the optical semiconductor element, which outputs light of a wavelength of a ultraviolet to blue region, for outputting the output light can be prevented, and therefore, the strong output light can be continuously emitted stably for a long period of time. Furthermore, there is no need to use special facilities but facilities and an environment used for assembling general optical semiconductor elements can be used for fabricating the present semiconductor device with high productivity.

BRIEF DESCRIPTION OF THE DRAWINGS

FIG. 1A is a cross-sectional view thereof, FIG. 1B is a side view thereof and FIG. 1C is a plan view thereof.

FIG. 2 is a table for showing results of a lifetime test of the semiconductor device of Embodiment 1 of the invention.

FIG. 5A is a plan view thereof and FIG. 5B is a cross-sectional view thereof taken on line Vb-Vb of FIG. 5A.

FIG. 6A is a plan view thereof and FIG. 6B is a cross-sectional view thereof taken on line VIb-VIb of FIG. 6A.

DETAILED DESCRIPTION OF THE INVENTION

Embodiment 1

Figure 1A:
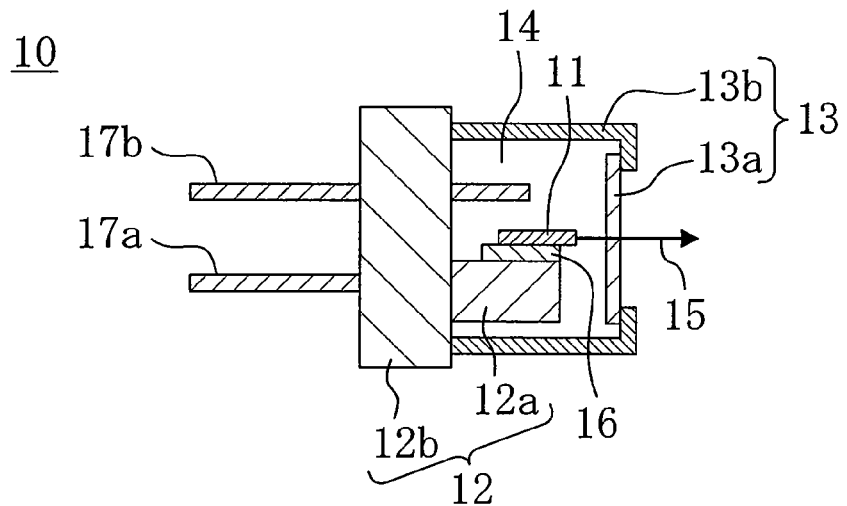
FIGS. 1A, 1B and 1C are diagrams of a semiconductor device according to Embodiment 1 of the invention, and specifically.
Figure 1B:
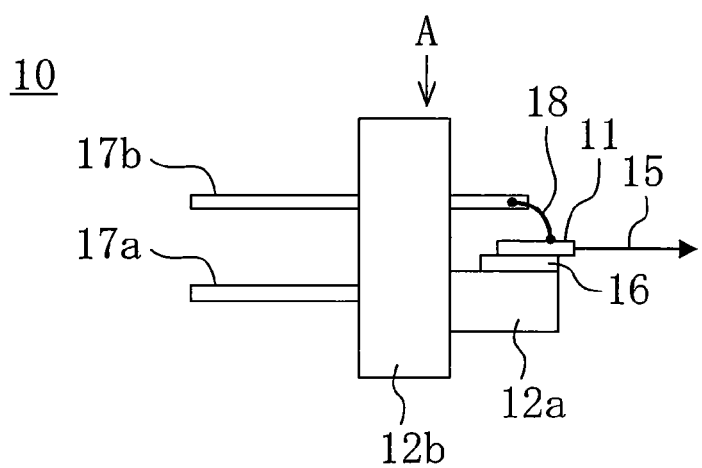
Figure 1C:
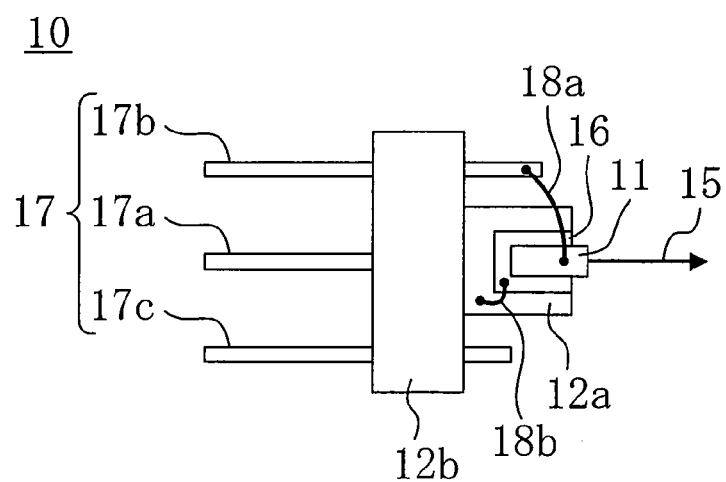

FIGS. 1A through 1C show an exemplified semiconductor device according to Embodiment 1 of the invention, and specifically, FIG. 1A is a cross-sectional view of the semiconductor device of this embodiment including an optical semiconductor element, a base of a package and an optical member of a cap, FIG. 1B is a side view taken along the same direction as FIG. 1A with the whole cap removed and FIG. 1C is a plan view taken along a direction of an arrow A of FIG. 1B.

As shown in FIG. 1A, the semiconductor device 10 includes a semiconductor laser diode 11, that is, the optical semiconductor element, for emitting light of a wavelength of 450 nm or less; the package 12 in which the semiconductor laser diode 11 is mounted and which is composed of the base 12a of a metal and a package body 12b; the cap 13 covering the semiconductor laser diode 11 together with the package 12 and composed of the optical member 13a and a metal member 13b; and an enclosed space 14 formed by the package 12 and the cap 13, and a gas including oxygen and moisture in given ratios is encapsulated within the enclosed space 14.

Preferably, the gas encapsulated within the enclosed space 14 includes oxygen in a ratio not less than 15% and less than 30%, is controlled to have a dew-point not less than −15° C. and not more than −5° C., and includes an inert gas such as nitrogen or argon in a ratio of 70% or more.

As shown in FIG. 1A, in the semiconductor laser diode 11 corresponding to the optical semiconductor element, a cavity is formed by end facets opposing in the lateral direction in FIG. 1A. Output light 15 emitted from the right end facet of the semiconductor laser diode 11 passes through the transparent optical member 13a of the cap 13 to be output. In the case where the semiconductor laser diode 11 is made of a nitride semiconductor material, a double-hetero structure including a multiple quantum well active layer is formed on an n-type GaN substrate by using a gallium nitride (GaN)-based material (such as aluminum gallium nitride (AlGaN), indium gallium nitride (InGaN) or GaN), and a ridge-shaped refractive index-guiding type optical waveguide structure is formed in a part of a cladding layer along an optical axis of the cavity. The length of the cavity of the semiconductor laser diode 11 is 600 μm, and a laser beam of a wavelength of 405 nm is emitted as the output light 15.

Furthermore, the base 12a and the package body 12b of the package 12 are both made of a metal material, for example, copper with high heat conductivity. The cap 13 includes the transparent optical member 13a and the metal member 13b in a cylindrical shape arranged perpendicularly along, for example, the optical axis so as to transmit the output light 15 from the semiconductor laser diode 11. The package 12 and the cap 13 together form the enclosed space 14 with the package body 12b and the metal member 13b welded to each other. Specifically, although not shown in the drawings, the cylindrical metal member 13b corresponding to the side face of the cap 13 is welded to the package body 12b. In the enclosed space 14, a sub-mount 16 made of aluminum nitride (AlN) and having a surface covered with a meal film, that is, a material with a high heat dissipation property, is formed on the base 12a, and the semiconductor laser diode 11 is mounted on the sub-mount 16, so that heat generated when the semiconductor laser diode 11 emits light can be rapidly released. It is noted that the sub-mount 16 may be made of, instead of AlN, any of appropriately selected materials with high heat conductivity and a small thermal expansion coefficient against the semiconductor laser diode, such as silicon carbide (SiC), aluminum oxide ($Al_2O_3$) or a silicon (Si)-based material.

Now, the operation of the semiconductor laser diode 11 will be described.

As shown in FIGS. 1B and 1C, the semiconductor device 10 is provided with a first lead terminal 17a electrically connected to the base 12a of the package 12 and a second lead terminal 17b and a third lead terminal 17c electrically insulated from the package 12 and penetrating through the package body 12b of the package 12, and the semiconductor laser diode 11 and the second lead terminal 17b are electrically connected to each other through a first conducting wire 18a. Also, the sub-mount 16 and the base 12a are electrically connected to each other through a second conducting wire 18b. A current is injected into the semiconductor laser diode 11 through the first lead terminal 17a and the second lead terminal 17b, so as to operate the semiconductor laser diode 11. Although not shown in the drawings, in the case where a light receiving element for monitoring the optical output is provided behind the edge of the package body 12b of the semiconductor laser diode 11, the third lead terminal 17c is used for operating the light receiving element connected through a first conducting wire 18a. The first lead terminal 17a, the second lead terminal 17b and the third lead terminal 17c together form a lead terminal part 17.

Next, a lifetime test carried out on the semiconductor device 10 including such a semiconductor laser diode 11 will be described.

FIG. 2 is a table for showing results of the lifetime test for the gas encapsulated within the enclosed space 14 of the semiconductor device 10 with the oxygen included in the gas and the dew-point of the gas used as parameters. The lifetime test of the semiconductor device 10 is performed as follows: Semiconductor devices 10 respectively fabricated with the oxygen concentration in the gas encapsulated within the enclosed space 14 changed in a range from 10% to 50% and with the dew-point of the gas changed in a range from −3° C. to −20° C. are subjected to a continuous test of 500 hours with a constant optical output (continuous wave: CW) of 20 mW at a case temperature Tc of 70° C. In each of the semiconductor devices 10, the optical output characteristic against a current, the wavelength, the spread angle and the like of the semiconductor laser diode 11 are measured at the start of the test and at the end of the test 500 hours after. It is noted that the case temperature Tc corresponds to a temperature of the package measured on the rear face of the base where the semiconductor laser diode 11 is mounted.

As shown in FIG. 2, when the oxygen concentration of the gas encapsulated within the enclosed space 14 is 50% or more, some of the semiconductor laser diodes 11 are degraded. In such a degraded semiconductor laser diode 11, an operating current value Iop is increased by more than 20% as compared with that obtained at the start of the test, and in addition, is increased abruptly after 10% increase, resulting in failing in emitting the output light 15 in a short period of time. Also, when the dew-point is −3° C. or more, fine dew is caused on the end facet of the semiconductor laser diode 11 in some of the semiconductor devices. In such a semiconductor laser diode 11 having the dew, it is found in the characteristic check performed after 500 hours of the lifetime test that a part of a far-field pattern corresponding to the spread angle is deformed. Furthermore, when the dew-point is −20° C. or less and the oxygen concentration is low, a product is adhered onto the end facet of the semiconductor laser diode 11 in some of the semiconductor devices. In such a semiconductor laser diode 11 having the product adhered, it is found in the characteristic check performed after the 500 hours of the lifetime test that the operating current value Iop is increased by 20% or more as compared with that obtained at the start of the test although it emits the output light.

Accordingly, as shown in FIG. 2, in the lifetime test for the semiconductor devices 10 where the oxygen concentration is higher than 10% and lower than 50% and the dew-point is higher than −20° C. and lower than −3° C. in the encapsulated gas, satisfactory results are obtained when the semiconductor laser diode 11 is mounted in a space including a gas having an oxygen concentration not less than 15% and less than 30% and a dew-point not less than −15° C. and not more than −5° C.

Next, FIGS. 3A through 3D are graphs for showing the relationship between a test time and an operating current value Iop obtained in a lifetime test of a semiconductor device 10 including a semiconductor laser diode 11 encapsulated in an enclosed space 14 together with a gas with a given oxygen concentration and a given dew-point. The lifetime test is performed with a pulse output of 60 mW when driven with a pulse current of a duty of 30% at a case temperature Tc of 60° C., and semiconductor devices 10 of every lot (n=5, whereas n is the number of semiconductor devices 10) is subjected to the test. The oxygen concentration and the dew-point of the enclosed space 14 are respectively 15% and −15° C. in FIG. 3A, respectively 18% and −10° C. in FIG. 3B, respectively 30% and −15° C. in FIG. 3C and respectively 50% and −20° C. in FIG. 3D.

Figure 3A:
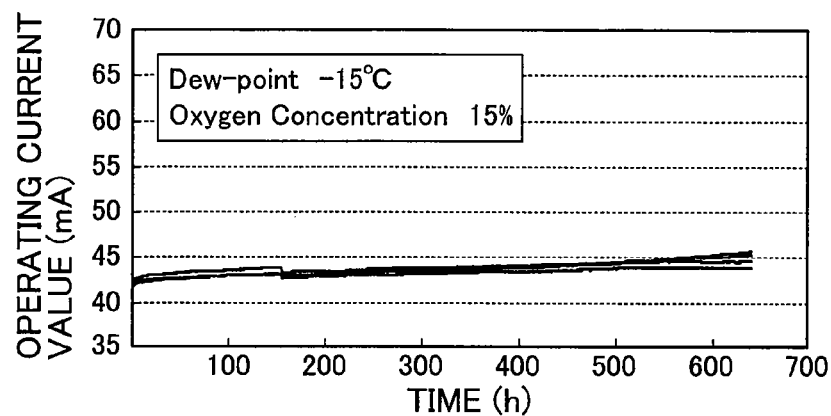
FIGS. 3A, 3B, 3C and 3D are graphs for showing the results of the lifetime test of the semiconductor device of Embodiment 1 of the invention.
Figure 3B:
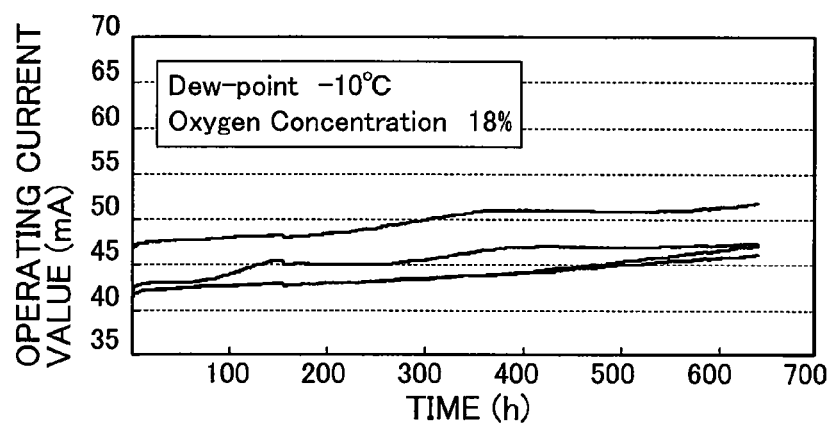
Figure 3C:
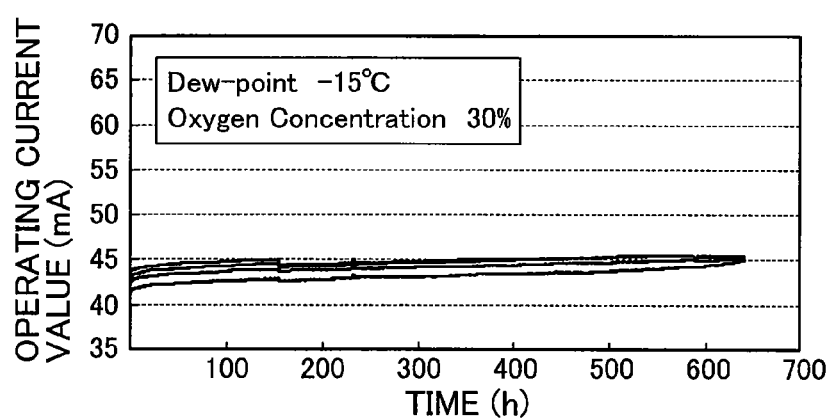
Figure 3D:
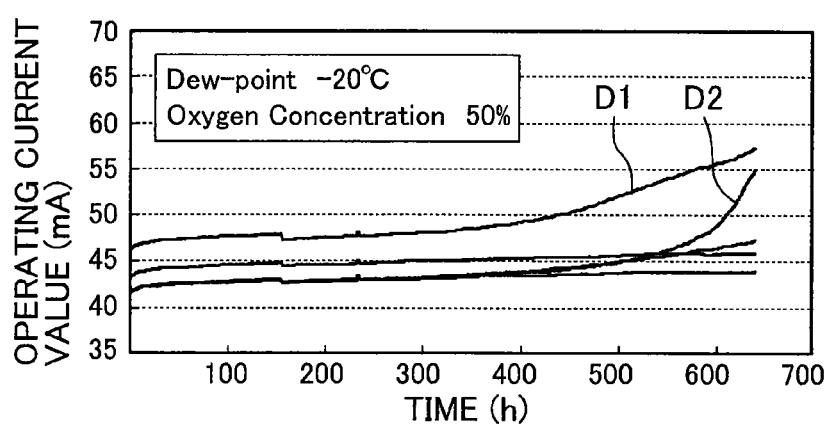

As shown in FIGS. 3A through 3C, in each of these semiconductor devices 10, the semiconductor laser diode 11 is encapsulated together with a gas with an oxygen concentration of 15% through 30% and a dew-point of −50° C. through −15° C., which is found to be particularly satisfactory in the lifetime test shown in FIG. 2, and the operating current value Iop is slightly changed from the start of the test even after a test time of 600 hours or more. On the other hand, in each of the semiconductor devices 10 shown in FIG. 3D, the semiconductor laser diode 11 is encapsulated together with a gas found not to be satisfactory in the lifetime test. These semiconductor devices include a sample D1 in which a failure is caused because the operating current value Iop is gradually increased as the test time passes and a sample D2 in which degradation is probably caused in a short period of time because the operating current value Iop is abruptly increased.

Next, the reason why the fine dew is caused and the product is produced on the end facet of the semiconductor laser diode 11 will be described.

Figure 4:
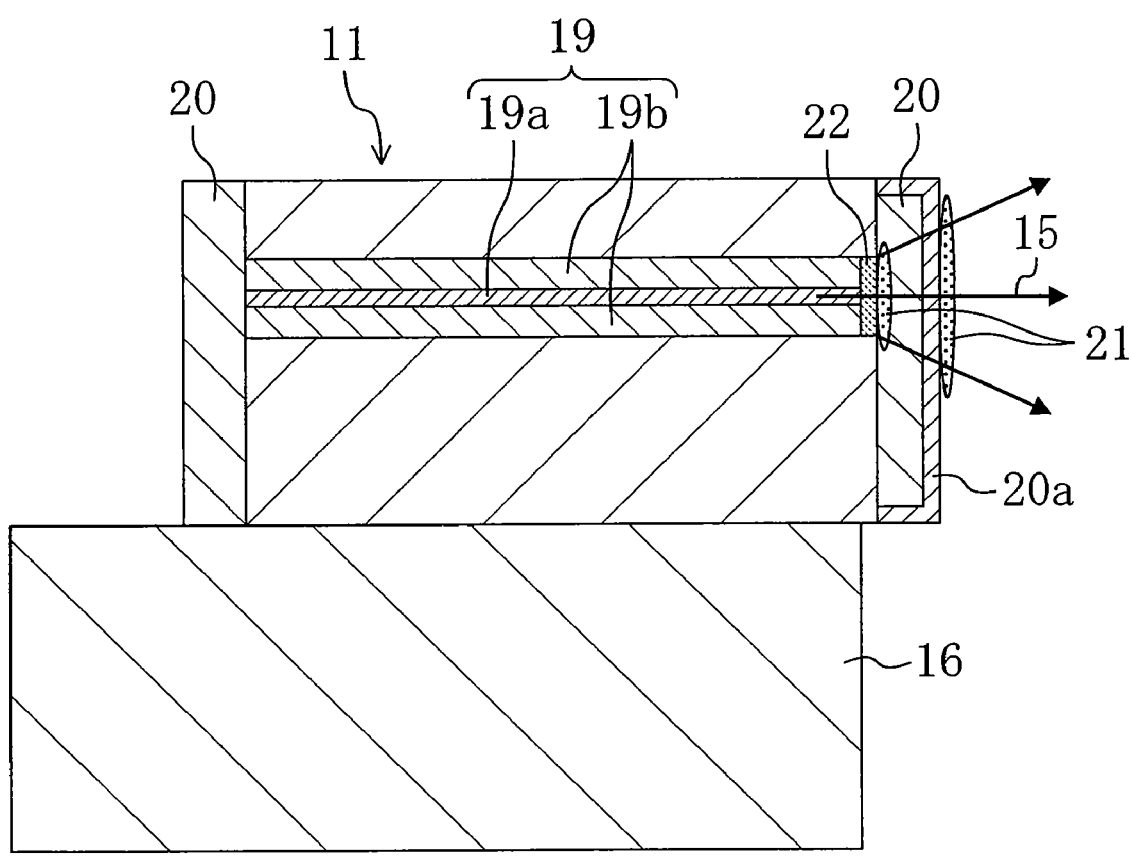
FIG. 4 is a cross-sectional view in which a semiconductor element of this invention is mounted on a sub-mount.

FIG. 4 is a schematic cross-sectional view of the sub-mount 16 and the semiconductor laser diode 11 mounted on the sub-mount 16.

As shown in FIG. 4, the semiconductor laser diode 11 includes an optical waveguide layer 19 composed of an active layer 19a with, for example, a multiple quantum well structure and cladding layers 19b sandwiching the active layer 19a in the vertical direction. The cavity is constructed because the end facets opposing along the extending direction of the optical waveguide layer 19 work as reflecting faces, and thus, the output light 15 is emitted from one end facet. Also, an edge coating 20 is formed adjacent to the end facets of the semiconductor laser diode 11 working as the reflecting faces, and the edge coating 20 is made of a material including zirconium such as zirconium oxide ($ZrO_2$).

Since the edge coating 20 made of the material including zirconium has a water absorbing property, a part of the edge coating 20 in contact with the gas absorbs a moisture component of the gas, and a water absorption layer 20a seems to be thus formed. Even after the water absorption layer 20a has been formed, the moisture component of the gas is probably collected as dew outside the water absorption layer 20a formed on the edge coating 20 although not shown in the drawing. In this manner, fine dew is caused on the end facet of the semiconductor laser diode 11, which seems to lead to the results of the lifetime test shown in FIG. 2.

The dew is caused in this manner, and in the case where the gas has a dew-point of −20° C. or less, the water absorption layer 20a is not formed and the dew is not observed even through the gas is in contact with the edge coating 20. However, a product included in the gas and a material of the product adhere onto the semiconductor laser diode 11 including its end facet and the edge coating 20. When the adhering product is irradiated with the strong output light 15 of a blue to ultraviolet region of a wavelength of a 400 nm or shorter band emitted from the end facet, a stable adhered product 21 is produced to be fixed onto the end facet for emitting the output light 15 and onto the edge coating 20. The output light 15 is absorbed or scattered by the end facet where the adhered product 21 is thus adhered, and hence, the operating current value Iop of the semiconductor laser diode 11 is increased for attaining a constant optical output, resulting in causing degradation and failure. The reason why the operating current value Iop is increased when the dew-point of the gas is as low as −20° C. or less in the lifetime test shown in FIG. 2 can be explained in this manner. The same phenomenon occurs in the sample D1 shown in FIG. 3D.

Furthermore, even in the case where the product included in the gas and the material of the product adhere onto the semiconductor laser diode 11 including its end facet and the edge coating 20, when the oxygen concentration of the gas falls in an appropriate range, the product and the material of the product can be decomposed or peeled off so as not to continuously adhere. However, when the oxygen concentration of the gas is as high as 50% or more, an oxidized region 22 having a crystal defect or an optical absorber is formed within the optical waveguide layer 19, which can be a factor to increase the operating current value Iop. The same phenomenon occurs in the sample D2 shown in FIG. 3D.

As described so far, when the semiconductor laser diode 11 is mounted within the space 14 encapsulating the gas including 70% or more of inert gas, having an oxygen concentration of 10% through 30% and having a dew-point not less than −15° C. and not more than −5° C., the adhesion of a product onto the end facets of the semiconductor laser diode 11 can be prevented or suppressed. Therefore, the semiconductor laser diode 11 can continuously emit the strong output light 15 stably for a long period of time.

Furthermore, the oxygen concentration and the dew-point of the gas encapsulated within the space 14 together with the semiconductor laser diode 11 are close to those of the general air, and hence, any facility for attaining a special environment is not necessary for the fabrication of the semiconductor device 10. Therefore, the semiconductor device 10 capable of continuously emitting strong output light stably for a long period time can be fabricated easily and inexpensively.

Although the semiconductor laser diode is described as an example of the optical semiconductor device in Embodiment 1, the semiconductor device may include, instead of the semiconductor laser diode, an edge emitting light emitting diode including a cavity formed by a front end facet and a rear end facet of the optical semiconductor device.

Furthermore, although nitrogen or argon is described as an example of the inert gas in Embodiment 1, a mixed gas of nitrogen and argon or the like may be used instead.

Embodiment 2

Figure 5A:
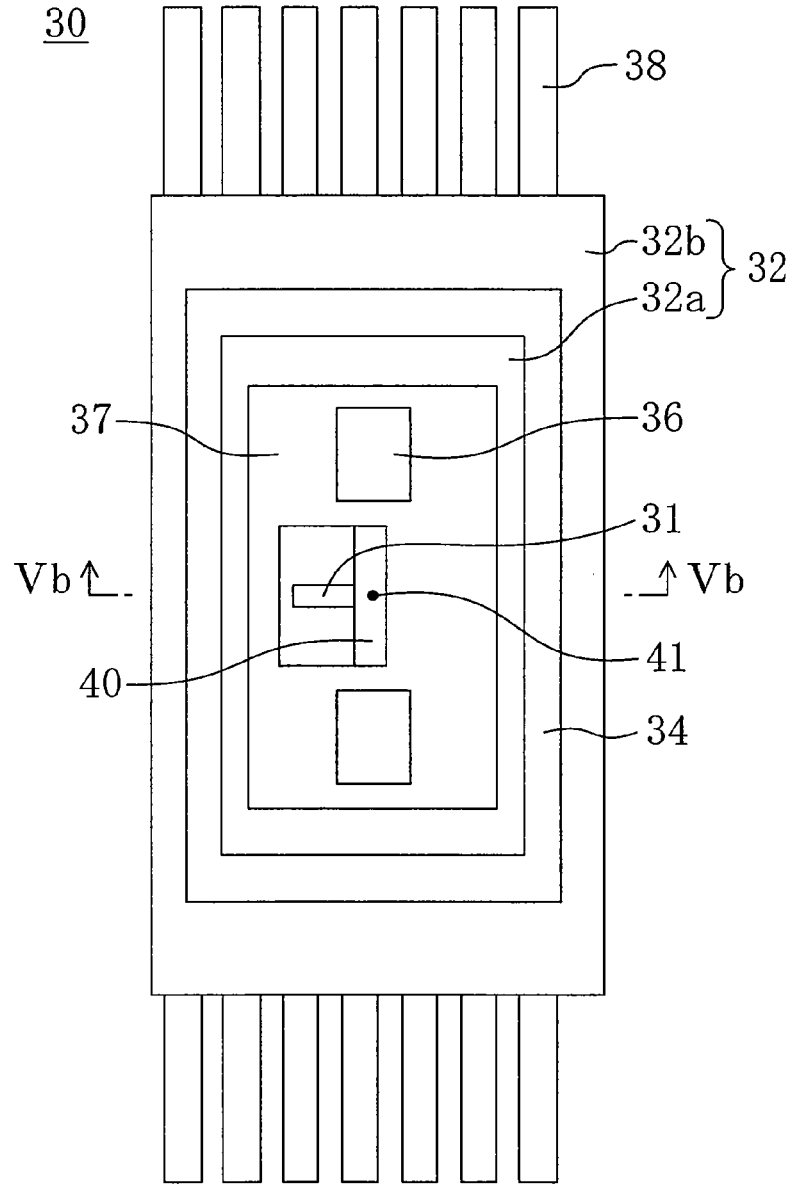
FIGS. 5A and 5B are diagrams of a semiconductor device according to Embodiment 2 of the invention, and specifically.
Figure 5B:
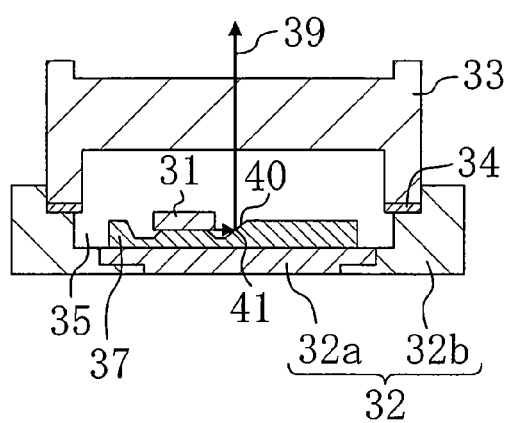

FIGS. 5A and 5B show a semiconductor device 30 described as an example of a semiconductor device according to Embodiment 2 of the invention, and specifically, FIG. 5A is a plan view of the semiconductor device 30 from which a cap is removed and FIG. 5B is a cross-sectional view thereof taken on line Vb-Vb of FIG. 5A. It is noted that the semiconductor device 30 is provided with the cap in FIG. 5B.

As shown in FIGS. 5A and 5B, the semiconductor device 30 includes a semiconductor laser diode 31 for emitting light of a wavelength of 450 nm or less as an optical semiconductor element; a package 32 composed of a base 32a of a metal on which the semiconductor laser diode 31 is mounted and a package body 32b made of a resin material; and a cap 33 made of a transparent optical member, and the semiconductor laser diode 31 is mounted within an enclosed space 35 formed by fixing the cap 33 on the package 32 with an adhesive 34. A gas including 70% or more of nitrogen as an inert gas, including 15% or more of oxygen and having a dew-point not less than −15° C. and not more than −5° C. is encapsulated within the enclosed space 35. Also, the semiconductor laser diode 31 is mounted in a recess formed on a principal plane of a Si semiconductor element 37 including a light receiving element 36 formed on the base 32a. Furthermore, the semiconductor laser diode 31 and the Si semiconductor element 37 are connected to an external circuit through a lead terminal 38 of the package 32 to be electrically driven. Each electrode terminal (not shown) of the semiconductor laser diode 31 and the Si semiconductor element 37 is electrically connected through a conducting wire (not shown). It is noted that a semiconductor chip (not shown) including a light receiving element 36 may be used instead of the Si semiconductor element 37. Also in Embodiment 2, the semiconductor laser diode 31 is made of a GaN-based material as in Embodiment 1.

Moreover, the base 32a of the package 32 can be provided on a module base (not shown) or a circuit substrate (not shown) for improving the heat dissipation property, the semiconductor laser diode 31 can emit strong output light 39 further stably for a long period of time. Moreover, the Si semiconductor element 37 and the semiconductor laser diode 31 can be integrated compactly on the base 32a within the enclosed space 35. Therefore, when it is used in an optical pickup for an optical disk, a diffractive optical element or the like (not shown) is formed on the cap 33 made of a transparent optical member, so as to optically couple an optical system or the like of an optical disk or an optical pickup with the Si semiconductor element 37 and the semiconductor laser diode 31.

For example, as shown in FIG. 5B, the semiconductor laser diode 31 is mounted in a recess formed on the top face of the Si semiconductor element 37. Also, a reflecting mirror 40 for reflecting the output light 39 is formed on an inner wall of the recess on a side of the semiconductor laser diode 31 for emitting the output light 39. When the semiconductor laser diode 31 of the semiconductor device 30 having such an architecture is electrically driven, the output light 39 is emitted from the end facet of the semiconductor laser diode 31 as shown in FIG. 5B, is reflected to be directed from a dummy light emitting point 41 upward, namely, toward the cap 33, by the reflecting mirror 40 formed in the Si semiconductor element 37 and transmits the cap 33 made of a transparent optical member to be output.

Also with respect to the semiconductor device 30 having the aforementioned architecture, the results of the lifetime test performed by using the oxygen concentration and the dew-point of the gas encapsulated within the enclosed space 35 as parameters are similar to those obtained in Embodiment 1.

As described so far, when the semiconductor laser diode 31 is included in the semiconductor device 30 to be encapsulated together with the gas including 70% or more of inert gas, including 15% or more of oxygen and having a dew-point not less than −15° C. and not more than −5° C., the adhesion of a product onto the end facet of the semiconductor laser diode 31 for emitting the output light 39 can be prevented or suppressed. Therefore, the semiconductor laser diode 31 can continuously emit the strong output light 39 stably for a long period of time.

Furthermore, the oxygen concentration and the dew-point of the gas encapsulated within the enclosed space 35 together with the semiconductor laser diode 31 are close to those of the general air, and hence, no additional facility for attaining a special environment is necessary for the fabrication of the semiconductor device 30. Therefore, the semiconductor device 30 capable of continuously emitting the strong output light 39 stably for a long period time can be fabricated easily and inexpensively.

Embodiment 3

Figure 6A:
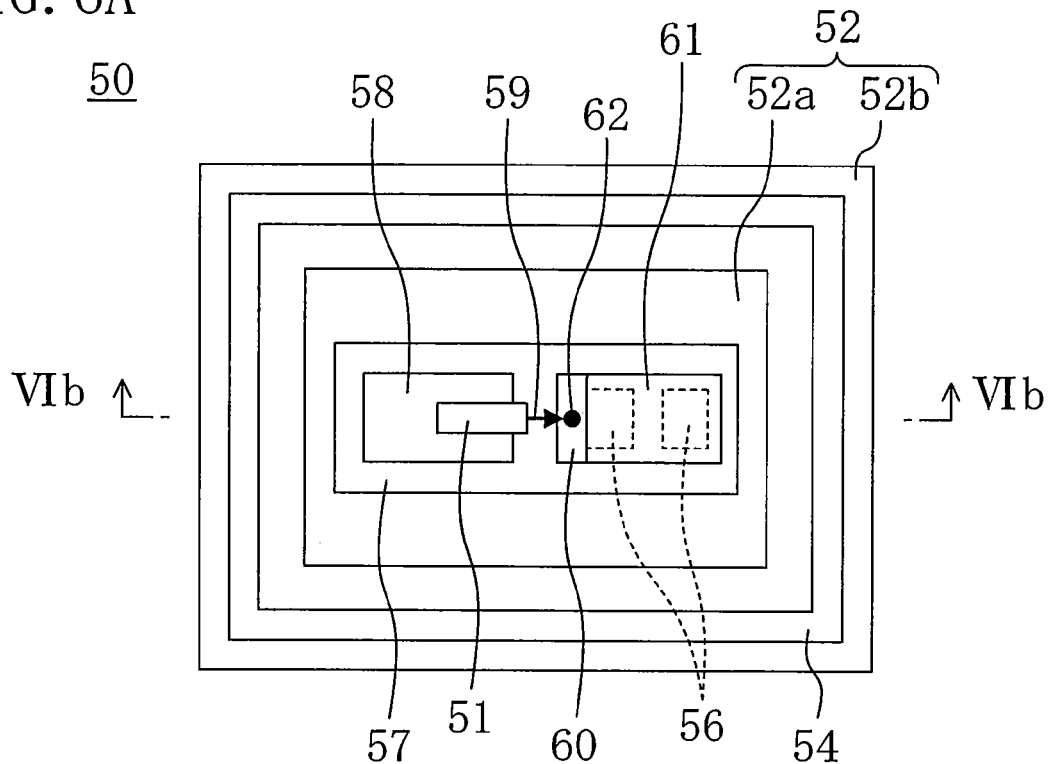
FIGS. 6A and 6B are diagrams of a semiconductor device according to Embodiment 3 of the invention, and specifically.
Figure 6B:
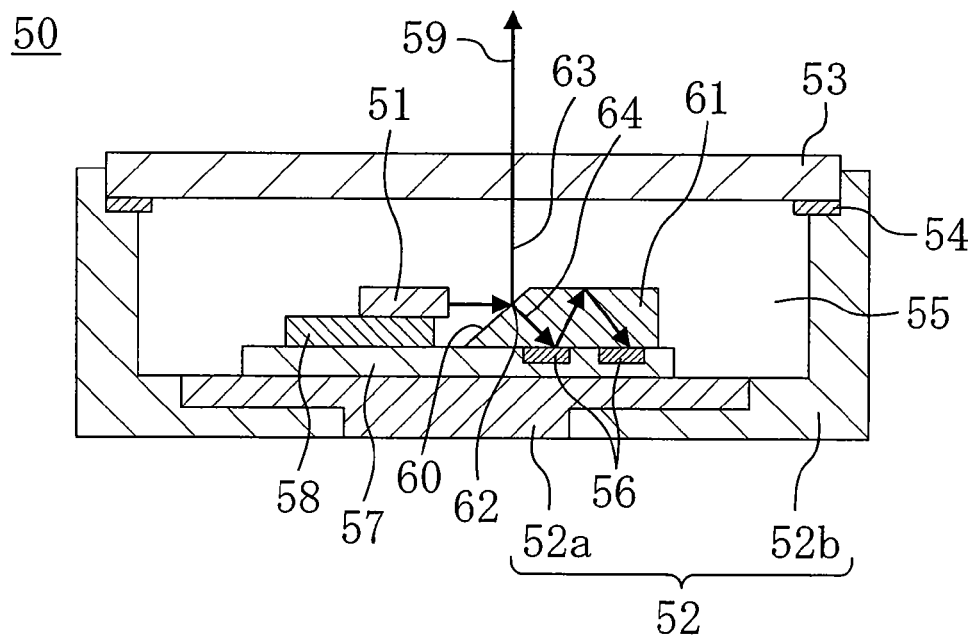

FIGS. 6A and 6B show a semiconductor device 50 described as an example of a semiconductor device according to Embodiment 3 of the invention, and specifically, FIG. 6A is a plan view of the semiconductor device 50 from which a cap is removed and FIG. 6B is a cross-sectional view thereof taken on line VIb-VIb of FIG. 6A. It is noted that the semiconductor device 50 is provided with the cap in FIG. 6B.

As shown in FIGS. 6A and 6B, the semiconductor device 50 includes a semiconductor laser diode 51 for emitting light of a wavelength of 450 nm or less as an optical semiconductor element; a package 52 composed of a base 52a of a metal on which the semiconductor laser diode 51 is mounted and a package body 52b made of a ceramic material; and a cap 53 made of a transparent optical member, and the semiconductor laser diode 51 is mounted within an enclosed space 55 formed by fixing the cap 53 on the package 52 with an adhesive 54. A gas including 70% or more of nitrogen as an inert gas, including 15% or more of oxygen and having a dew-point not less than −15° C. and not more than −5° C. is encapsulated within the enclosed space 55. A Si semiconductor element 57 including a light receiving element 56 is formed on the base 52a, a sub-mount 58 made of a material with a high heat dissipation property such as AlN is built on the Si semiconductor element 57, and the semiconductor laser diode 51 is mounted on the sub-mount 58 to be encapsulated together with the gas. The semiconductor laser diode 51 and the Si semiconductor element 57 are connected to an external circuit through a lead terminal (not shown) of the package 52 to be electrically driven. Each electrode terminal (not shown) of the semiconductor laser diode 51 and the Si semiconductor element 57 is electrically connected to a lead terminal (not shown) through a conducting wire (not shown), and a lead terminal (not shown) connected to the electrode terminal of the semiconductor laser diode 51 or the Si semiconductor element 57 is buried within the package body 52 with a part of the electrode exposed. It is noted that a semiconductor chip (not shown)

including a light receiving element 56 may be used instead of the Si semiconductor element 57. Also in Embodiment 3, the semiconductor laser diode 51 made of a GaN-based material is used as the optical semiconductor element as in Embodiments 1 and 2.

Moreover, the base 52a of the package 52 can be provided on a module base (not shown) or a circuit substrate (not shown) for improving the heat dissipation property, the semiconductor laser diode 51 can emit strong output light 59 further stably for a long period of time. Moreover, the Si semiconductor element 57 and the semiconductor laser diode 51 can be integrated compactly on the base 52a within the enclosed space 55.

For example, when a prism 61 having a semitransparent mirror 60 is provided on the Si semiconductor element 57 so as to oppose the semiconductor laser diode 51 as shown in FIGS. 6A and 6B, the output light 59 emitted from the semiconductor laser diode 51 is directed from a dummy light emitting point 62 upward, namely, toward the cap 53, by the semitransparent mirror 60. The output light 59 thus directed upward is used for reading information from an optical disk (not shown) and is reflected to be changed into signal light 63, which is allowed to enter the prism 61 by the semitransparent mirror 60. The signal light 63 having entered the prism 61 is changed within the prism into incident light 64 reflecting on the edge of the prism, and a part of the incident light 64 is detected by the light receiving element 56 of the Si semiconductor element 57, and thus, a signal recorded on the optical disk is read.

Also with respect to the semiconductor device 50 having the aforementioned architecture, the results of the lifetime test performed by using the oxygen concentration and the dew-point of the gas encapsulated within the enclosed space 55 as parameters are similar to those obtained in Embodiment 1.

As described so far, when the semiconductor laser diode 51 is included in the semiconductor device 50 to be encapsulated with the gas including 70% or more of inert gas, including 15% or more of oxygen and having a dew-point not less than −15° C. and not more than −5° C., the adhesion of a product onto the end facet of the semiconductor laser diode 51 for emitting the output light 59 can be prevented or suppressed. Therefore, the semiconductor laser diode 51 can continuously emit the strong output light 59 stably for a long period of time.

Furthermore, the oxygen concentration and the dew-point of the gas encapsulated within the enclosed space 55 together with the semiconductor laser diode 51 are close to those of the general air, and hence, any facility for attaining a special environment is not necessary for the fabrication of the semiconductor device 50. Therefore, the semiconductor device 50 capable of continuously emitting the strong output light 59 stably for a long period time can be fabricated easily and inexpensively.

Although the semiconductor laser diode is described as an example of the optical semiconductor device also in Embodiment 3, the semiconductor device may include, instead of the semiconductor laser diode, an edge emitting light emitting diode including a cavity formed by a front end facet and a rear end facet of the optical semiconductor device.

As described above, the semiconductor device of this invention can emit strong output light stably for a long period of time while preventing adhesion of a product onto an end facet of an optical semiconductor element for emitting the output light, and therefore, the invention is useful for, for example, a semiconductor device or the like including an optical semiconductor element for emitting light of a wavelength of a blue to ultraviolet region.

What is claimed is:

1. A semiconductor device comprising:
an optical semiconductor element;
a package including a base made of a metal for mounting the optical semiconductor element; and
a cap for encapsulating the optical semiconductor element and a gas by covering the package and the optical semiconductor element,
wherein a first edge coating made of a material including zirconium is disposed on an emitting end facet of the optical semiconductor element, and
a water absorption layer is disposed on the first edge coating.

2. The semiconductor device of claim 1, wherein the optical semiconductor element is a semiconductor laser diode or an edge emitting light emitting diode including a cavity formed by opposing end facets.

3. The semiconductor device of claim 1, wherein the optical semiconductor element emits light of a wavelength of 450 nm or less.

4. The semiconductor device of claim 1, wherein the optical semiconductor element is made of a nitride semiconductor material.

5. The semiconductor device of claim 1, wherein the gas includes 70% or more of inert gas.

6. The semiconductor device of claim 5, wherein the inert gas includes at least one of nitrogen and argon.

7. The semiconductor device of claim 5, wherein the inert gas is nitrogen.

8. The semiconductor device of claim 1, further comprising a sub-mount provided between the optical semiconductor element and the base and having a high heat dissipation property.

9. The semiconductor device of claim 1, wherein a portion of the package excluding the base is made of a metal,
the cap includes a cylindrical metal member and a transparent optical member provided on the metal member for transmitting output light from the optical semiconductor element, and
the package and the metal member are welded to each other.

10. The semiconductor device of claim 1, wherein a portion of the package excluding the base is made of a resin,
the cap is made of a transparent optical member, and
the package and the cap are adhered to each other through an adhesive.

11. The semiconductor device of claim 1, wherein a portion of the package excluding the base is made of ceramics,
the cap is made of a transparent optical member, and
the package and the cap are adhered to each other through an adhesive.

12. The semiconductor device of claim 1, further comprising a light receiving element or a semiconductor element including a light receiving element provided between the optical semiconductor element and the base.

13. The semiconductor device of claim 12, wherein the optical semiconductor element is mounted on a principal plane of the semiconductor element or in a recess formed on the principal plane.

14. The semiconductor device of claim 1, wherein the gas has an oxygen concentration not less than 15% and less than 30%, and has a dew-point not less than −15° C. and not more than −5° C.

15. The semiconductor device of claim 14, wherein the gas has a dew-point greater than −10° C. and not more than −5° C.

16. The semiconductor device of claim 1, wherein the first edge coating on the emitting end facet is made of zirconium oxide.

17. The semiconductor device of claim 1, further comprising a second edge coating disposed on another end facet opposite to the emitting end facet of the optical semiconductor element.

* * * * *